United States Patent [19]
Sukharev et al.

[11] Patent Number: 6,147,012
[45] Date of Patent: Nov. 14, 2000

[54] PROCESS FOR FORMING LOW K SILICON OXIDE DIELECTRIC MATERIAL WHILE SUPPRESSING PRESSURE SPIKING AND INHIBITING INCREASE IN DIELECTRIC CONSTANT

[75] Inventors: Valeriy Sukharev, Cupertino; Wei-Jen Hsia, Sunnyvale, both of Calif.

[73] Assignee: LSI Logic Corporation, Milpitas, Calif.

[21] Appl. No.: 09/438,642

[22] Filed: Nov. 12, 1999

[51] Int. Cl.$^7$ ................................................. H01L 21/31
[52] U.S. Cl. .......................... 438/787; 438/466; 438/789; 438/790
[58] Field of Search .................... 438/466, 787, 438/789, 790

[56] References Cited

U.S. PATENT DOCUMENTS

| | | | |
|---|---|---|---|
| 3,012,861 | 12/1961 | Ling | 23/223.5 |
| 3,178,392 | 4/1965 | Kriner | 260/46.5 |
| 3,832,202 | 8/1974 | Ritchie | 106/287 |
| 3,920,865 | 11/1975 | Läufer et al. | 427/220 |
| 4,705,725 | 11/1987 | Glajch et al. | 428/405 |
| 5,194,333 | 3/1993 | Ohnaka et al. | 428/405 |
| 5,858,879 | 1/1999 | Chao et al. | 438/725 |
| 5,874,367 | 2/1999 | Dobson | 438/787 |
| 5,874,745 | 2/1999 | Kuo | 257/59 |
| 5,882,489 | 3/1999 | Bersin et al. | 204/192.35 |
| 5,904,154 | 5/1999 | Chien et al. | 134/1.2 |
| 6,054,379 | 4/2000 | Yau et al. | 438/623 |

OTHER PUBLICATIONS

Dielectrics for ULSI Multilevel Interconnection Conference, pp. 311–317, Feb. 1998.
Koda, S., "Kinetic Aspects of Oxidation and Combustion of Silane and Related Compounds", *Progress in Energy and Combustion Science*, vol. 18, No. 6, 1992, pp. 513–528. No month.
Lin, C., et al., "Decomposition of Hydrogen Peroxide at Elevated Temperatures" (Report), Electric Power Research Institute, Palo Alto, CA, 1990, abstract. No month.
McClatchie, S., et al., "Low Dielectric Constant Oxide Films Deposited Using CVD Techniques", 1998 Proceedings Fourth International DUMIC Conference, Feb. 16–17, 1998, pp. 311–318.
Peters, Laura, "Pursuing the Perfect Low–k Dielectric", *Semiconductor International*, vol. 21, No. 10, Sep., 1998, pp. 64–66, 68, 70, 72, and 74.
Arutyunyan, A., et al., "Formation of Radicals on the Surface of Oxides During Decomposition of $H_2O_2$", pp. 754–758 (Translated from Kinetika i Kataliz, vol. 29, No. 4, Jul.–Aug., 1988, pp. 880–884).
Bothra, S., et al., "Integration of 0.25$\mu$m Three and Five Level Interconnect System for High Performance ASIC", 1997 Proceedings Fourteenth International VMIC Conference, Santa Clara, CA, Jun. 10–12, 1997, pp. 43–48.
Dobson, C.D., et al., "Advanced $SiO_2$ Planarization Using Silane and $H_2O_2$", *Semiconductor International*, Dec. 1994, pp. 85–88.

*Primary Examiner*—John F. Niebling
*Assistant Examiner*—Alexander G. Ghyka

[57] ABSTRACT

A process for forming low k silicon oxide dielectric material having a dielectric constant no greater than 3.0, while suppressing pressure spikes during the formation of the low k silicon oxide dielectric material comprises reacting an organo-silane and hydrogen peroxide in a reactor chamber containing a silicon substrate while maintaining an electrical bias on the substrate. In a preferred embodiment the reactants are flowed into the reactor at a reactant flow ratio of organo-silane reactant to hydrogen peroxide reactant of not more than 10.6 sccm of organo-silane reactant per 0.1 grams/minute of hydrogen peroxide reactant; and the substrate is biased with either a positive DC bias potential, with respect to the grounded reactor chamber walls, of about +50 to +300 volts, or a low frequency AC bias potential ranging from a minimum of +50/−50 volts up to a maximum of about +300/−300 volts.

20 Claims, 1 Drawing Sheet

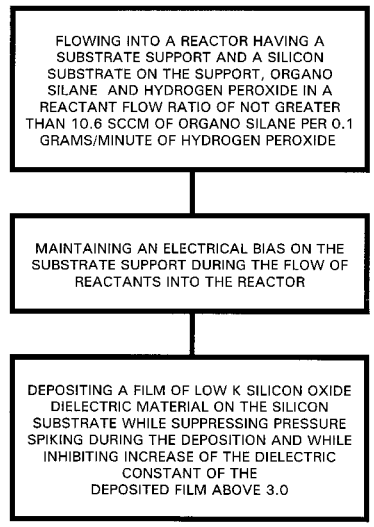

FLOWING INTO A REACTOR HAVING A SUBSTRATE SUPPORT AND A SILICON SUBSTRATE ON THE SUPPORT, ORGANO SILANE AND HYDROGEN PEROXIDE IN A REACTANT FLOW RATIO OF NOT GREATER THAN 10.6 SCCM OF ORGANO SILANE PER 0.1 GRAMS/MINUTE OF HYDROGEN PEROXIDE

MAINTAINING AN ELECTRICAL BIAS ON THE SUBSTRATE SUPPORT DURING THE FLOW OF REACTANTS INTO THE REACTOR

DEPOSITING A FILM OF LOW K SILICON OXIDE DIELECTRIC MATERIAL ON THE SILICON SUBSTRATE WHILE SUPPRESSING PRESSURE SPIKING DURING THE DEPOSITION AND WHILE INHIBITING INCREASE OF THE DIELECTRIC CONSTANT OF THE DEPOSITED FILM ABOVE 3.0

PROCESS FOR FORMING LOW K SILICON OXIDE DIELECTRIC MATERIAL WHILE SUPPRESSING PRESSURE SPIKING AND INHIBITING INCREASE IN DIELECTRIC CONSTANT

BACKGROUND OF THE INVENTION

1. Field of the Invention

This invention relates to a process for forming integrated circuit structures. More particularly, this invention relates to a process for forming low dielectric constant silicon oxide dielectric material while suppressing pressure spiking and inhibiting increase of the dielectric constant of such low dielectric constant silicon oxide dielectric material.

2. Description of the Related Art

In the continuing reduction of scale in integrated circuit structures, both the width of metal interconnects or lines and the horizontal spacing between such metal lines on any particular level of such interconnects have become smaller and smaller. As a result, horizontal capacitance has increased between such conductive elements. This increase in capacitance, together with the vertical capacitance which exists between metal lines on different layers, results in loss of speed and increased cross-talk. As a result, reduction of such capacitance, particularly horizontal capacitance, has received much attention. One proposed approach to solving this problem of high capacitance is to replace the conventional silicon oxide ($SiO_2$) dielectric material, having a dielectric constant (k) of about 4.0, with another dielectric material having a lower dielectric constant to thereby lower the capacitance.

Dobson et al., in "Advanced $SiO_2$ Planarization Using Silane and $H_2O_2$", published in Semiconductor International, Volume 17, No. 14, December 1994, at pages 85–88, describe a so-called "flowfill" process to deposit self-planarized layers of silicon dioxide with good gap-fill properties for high aspect ratio gaps, when silane ($SiH_4$) is reacted with an excess of hydrogen peroxide ($H_2O_2$) vapor (formed by flash vaporization of 30% or more concentrated $H_2O_2$) at low pressure. Under optimized conditions of pressure and temperature, flowable silica is deposited which has the ability to fill deep sub-micron features while at the same time providing excellent local and global planarization.

More recently, in an article by L. Peters, entitled "Pursuing the Perfect Low-K Dielectric", published in Semiconductor International, Volume 21, No. 10, September 1998, at pages 64–74, a number of low dielectric constant (low k) dielectric materials are disclosed and discussed. Included in these dielectric materials is a description of a low k dielectric material having a dielectric constant of about 3.0 formed using a modified version of the above-described Flowfill chemical vapor deposition (CVD) process developed by Trikon Technologies of Newport, Gwent, U.K. The process is said to react methyl silane ($CH_3$—$SiH_3$) with hydrogen peroxide ($H_2O_2$) to form monosilicic acid which condenses on a cool wafer and is converted into an amorphous methyl-doped silicon oxide which is annealed at 400° C. to remove moisture. The article goes on to state that beyond methyl silane, studies show a possible k of 2.75 using dimethyl silane in the Flowfill process.

An article by S. McClatchie et al. entitled "Low Dielectric Constant Oxide Films Deposited Using CVD Techniques", published in the 1998 Proceedings of the Fourth International Dielectrics For ULSI Multilevel Interconnection Conference (Dumic) held on February 16–17, 1998 at Santa Clara, Calif., at pages 311–318, also describes the formation of methyl-doped silicon oxide by the low-k Flowfill process of reacting methyl silane with $H_2O_2$ to achieve a dielectric constant of ~2.9. The authors then further describe the formation of low-k dielectric material using dimethyl silane $(CH_3)_2$—$SiH_2$, thereby achieving a dielectric constant of ~2.75.

While the ability to form low k silicon oxide dielectric films having the ability to fill deep sub-micron features while at the same time exhibiting excellent planarization is very desirable, it has been found that momentary pressure bursts or "spiking" can occur during the reaction, as well as the appearance of haze on the surface of the film apparently due to condensation problems, which all contribute negatively to the properties of the film. Furthermore, when process conditions such as methyl silane/hydrogen peroxide concentration ratio, total flow rates, and reactor chamber pressure are adjusted to avoid the occurrence of the pressure spiking, it has been found that loss of the low k properties of the film can occur, apparently due to decomposition of the organic group of the organo-silane reactant, e.g., the methyl group of methyl silane under the conditions favoring suppression of spiking.

It would, therefore, be desirable to provide a process for forming a low k silicon oxide dielectric material having the ability to fill deep sub-micron features while also exhibiting excellent planarization without the occurrence of pressure spiking or the occurrence of haze on the surface of the low k film, and without loss of the low k properties of the film.

SUMMARY OF THE INVENTION

In accordance with the invention low k silicon oxide dielectric material having a dielectric constant no greater than 3.0 is formed on a silicon substrate support while suppressing pressure spikes during the formation of the low k silicon oxide dielectric material by reacting an organo-silane and hydrogen peroxide in a reactor chamber containing a silicon substrate support while maintaining an electrical bias on the substrate support. In a preferred embodiment the reactants are flowed into the reactor at a ratio of organo-silane reactant to hydrogen peroxide reactant of not more than 10.6 sccm of organo-silane reactant per 0.1 grams/minute of hydrogen peroxide reactant; and the substrate support is biased with either a positive DC bias potential, with respect to grounded reactor chamber walls, of about +50 to about +300 volts, or a low frequency AC bias potential of from a minimum of about +50/-5 volts, up to a maximum of about +300/-300 volts.

BRIEF DESCRIPTION OF THE DRAWINGS

The sole FIGURE is a flowsheet illustrating the process of the invention.

DETAILED DESCRIPTION OF THE INVENTION

The invention comprises a process for making low k silicon oxide dielectric material having a dielectric constant no greater than 3.0 on a silicon substrate while suppressing pressure spikes during the formation of the low k silicon oxide dielectric material. The process comprises reacting an organo-silane and hydrogen peroxide in a reactor chamber containing a silicon substrate support while maintaining an electrical bias on the substrate support to thereby form low k silicon oxide dielectric material having a dielectric constant no greater than 3.0 while suppressing pressure spikes.

In a preferred embodiment the reactants are flowed into the reactor at a ratio of organo-silane reactant to hydrogen peroxide reactant of not more than 10.6 sccm of organo-silane reactant per 0.1 grams/minute of hydrogen peroxide reactant; and the substrate is biased with either a positive DC bias potential, with respect to grounded reactor chamber walls, of from about +50 to about +300 volts or a low frequency AC bias potential of from a minimum of about +50/−50 volts, up to a maximum of about +300/−300 volts.

The term "low k", as used herein is intended to define a dielectric constant of 3.0 or less.

The term "organo-silane", as used herein is intended to include any substituted silane wherein one or more hydrogens in silane ($SiH_4$) have been replaced by an organic moiety, i.e., one or more organic moieties are bonded to the silicon atom in place of hydrogen in the silane molecule to form the organo-silane. Examples of such organo-silanes include methyl silane, dimethyl silane, and a substituted silane having at least one carbon-containing group thereon having the general formula —$(C)_y(CH_3)_z$, where y is an integer from 1 to 4 for a branched alkyl group and from 3 to 5 for a cyclic alkyl group and z is 2y+1 for a branched alkyl group and 2y−1 for a cyclic allyl group, as disclosed in Aronowitz et al. Ser. No. 09/274,457, filed on Mar. 22, 1999, and assigned to the assignee of this application, the subject matter of which is also hereby incorporated by reference.

The conventional flow of organo-silane and hydrogen peroxide reactants into a reactor to form silicon oxide by the flowfill process when using a 5 liter reactor, for example, ranges from about 100 to about 120 sccm of organo-silane and from about 0.5 to 0.8 grams per minute of hydrogen peroxide (typically about 0.75 grams/minute of hydrogen peroxide). That is, the reactant flow ratio of organo-silane reactant to hydrogen peroxide reactant in conventional prior art processes ranges from a minimum of about 12.5 sccm of the silane reactant per 0.1 gram/minute of hydrogen peroxide flow (100 sccm of organo-silane per 0.8 grams/minute of hydrogen peroxide in a 5 liter reactor), to a maximum of about 24 sccm of the organo-silane reactant per 0.1 gram/minute of hydrogen peroxide flow (120 sccm of organo-silane per 0.5 grams/minute of hydrogen peroxide in a 5 liter reactor).

In accordance with the invention, to suppress the occurrence of pressure spiking during the reaction, the rate of flow of the organo-silane reactant into the reactor is reduced, relative to the flow rate of the hydrogen peroxide reactant, by at least about 15% of the conventional prior art flow, preferably about 20%. That is the flow of the organo-silane reactant into the reactor in the process of the invention must not exceed 85%, and preferably not exceed 80%, of the conventional prior art flow of organo-silane into the reactor when the flow of peroxide is maintained within the conventional prior art flow range.

Thus, in accordance with the invention, the maximum flow of the organo-silane reactant into a reactor during the process of the invention should not exceed about 10.6 sccm of the organo-silane reactant per 0.1 gram/minute of peroxide flow (85% of the minimum conventional prior art ratio of 12.5 sccm of organo-silane reactant per 0.1 grams/minute of hydrogen peroxide), and preferably not exceed about 10 sccm of the organo-silane reactant per 0.1 gram/minute of peroxide flow (80% of the minimum conventional prior art ratio of 12.5 sccm of organo-silane reactant per 0.1 grams/minute of hydrogen peroxide). The minimum flow of the organo-silane reactant should be at least about 8 sccm per 0.1 grams/minute of hydrogen peroxide.

As an example, when the flow rate of hydrogen peroxide into a 5 liter reactor is about 0.5 grams/minute, the maximum flow rate of the organo-silane reactant should not exceed about 53 sccm (10.6 sccm organo-silane reactant per 0.1 gram/minute of hydrogen peroxide), and preferably should not exceed about 50 sccm (10 sccm organo-silane reactant per 0.1 gram/minute of hydrogen peroxide); while the maximum flow rate of the organo-silane reactant when the hydrogen peroxide flow rate is 0.8 grams/minute should not exceed about 85 sccm, and preferably should not exceed 80 sccm.

It will, of course, be understood that for larger or smaller reactors, the flow rates for the respective reactants will be adjusted accordingly and the actual flow rates to be used in any particular reactor are therefore equivalent to the recited flow rates for a 5 liter reactor.

While the above reduced flow rates of the organo-silane reactant will result in a suppression of the pressure spiking during the formation and deposition of the low k silicon oxide dielectric material, it has been found that this reduction of flow rate of the organo-silane reactant will at least sometimes result in an undesirable increase in the dielectric constant of the resulting silicon oxide film, apparently due to loss of carbon from the organo-silane reactant.

Therefore, in accordance with the invention a bias is applied to the substrate support during the reaction and deposition of the low k silicon oxide dielectric material to thereby provide a bias on the exposed surface of the substrate. In accordance with one embodiment of the invention, the bias applied to the substrate support may be a positive DC bias applied between the substrate support and the electrically grounded walls of the reactor. The potential of the bias applied to the substrate should range from the minimum bias potential capable of suppressing the above mentioned increase in the dielectric constant of the low k silicon oxide dielectric material above 3.0, up to a maximum bias potential below that level which may result in arcing and resulting damage to the substrate. Preferably, the DC bias potential applied to the substrate support will range from about +50 to about +300 volts.

In accordance with another embodiment of the invention, an alternating positive/negative (AC) bias potential may be applied between the substrate and the grounded walls of the reactor. The AC bias should be at low frequency (i.e., not exceeding about 500 kHz). As discussed above with respect to the DC bias potential, the potential of the AC bias applied to the substrate should range from the minimum positive/negative bias potential capable of suppressing the above mentioned increase in the dielectric constant of the low k silicon oxide dielectric material above 3.0, up to a maximum positive/negative bias potential below that level which may result in arcing and resulting damage to the substrate. Preferably, the positive/negative AC bias potential applied to the substrate support will range from a minimum of about +50/−50 volts up to a maximum of about +300/−300 volts.

While it is not desired to be bound by any theories as to why the process of the invention succeeds in achieving suppression of pressure spiking while maintaining the desired low dielectric constant of the silicon oxide film being deposited on the substrate, it is believed that the generation of excessive amounts of radicals such as O•, OH•, and H• during the formation of the low k silicon oxide dielectric material using, for example, methyl silane, can result in a chain initiated reaction between the radicals and the methyl silane, i.e., pressure spiking.

Reduction of the flow rate of methyl silane in the reaction, in accordance with the process of the invention, results in a reduction in the amount of methyl silyl formed by reaction between methyl silane and hydrogen peroxide. This, in turn, results in a reduction in the reaction between such methyl silyl and oxygen produced by reaction between peroxide radicals. That, in turn, results in a reduction in the amount of free radicals generated by the methyl silyl and oxygen reaction. Reduction in the amount of free radicals generated suppresses the chain initiated explosion or pressure spiking by reaction between the free radicals and methyl silane.

While the reduction of the flow of the organo-silane reactant, with respect to the hydrogen peroxide reactant, in accordance with the invention, has resulted in suppression of the pressure spiking during the reaction to form the film of low k silicon oxide dielectric material, it has been noted that such reduction in the flow rate of the organo-silane reactant has resulted in an undesirable rise in the dielectric constant (k value) of the resultant silicon oxide dielectric film. While again not wishing to be bound by any theories of operation, it is believed that this reduction of flow rate of the organo-silane reactant results in an increase of the residence time the reacting species spend in the gas phase area above the substrate. Increased residence time increases the probability of the decomposition of, for example, the methyl group of the organo-silane reactant when a methyl silane reactant is used, by means of abstraction of hydrogen atoms from the methyl group by reactive radicals. Biasing of the substrate, in accordance with the invention, reduces electron transfer from the surface of the substrate and the growing film to the hydrogen peroxide, resulting in less decomposition of hydrogen peroxide, resulting in a reduction in the amount of free radicals such as O•, OH•, H•, and HO$_2$• available to cause decomposition of the organo group (e.g., methyl) on the organo-silane reactant. Suppression of free radical generation and resultant reduction in decomposition of the organo group on the silane reactant by the application of a bias to the substrate support thus results in elimination of the undesirable rise in dielectric constant value in the film of low k silicon oxide dielectric material deposited on the substrate.

To further illustrate the practice of the invention, an 8 inch diameter silicon substrate having integrated circuit structure already formed thereon, including closely spaced apart raised metal lines (i.e., metal lines having spaces between them having a height to width ratio of at least 2, and usually about 3) may be placed on a substrate support in a 5 liter reactor maintained at a pressure of about 1 Torr, with the substrate support maintained at a temperature of about 0° C. While maintaining a +250 volt DC bias on the substrate support, hydrogen peroxide is flowed into the chamber at a rate of about 0.75 grams/minute while methyl silane is flowed into the reactor at a rate of about 75 sccm. During the deposition of low k silicon oxide dielectric material on the silicon substrate, the deposition can be visually monitored through a window in the reactor for signs of optical flashing, indicative of the occurrence of a pressure spike during the deposition. No optical flashing will be noted, indicative of the absence of pressure spiking. A pressure gauge can be connected to the reactor to monitor the internal pressure in the reactor to note the possible occurrence of pressure spikes and no such sudden increases in pressure will be observed. After a sufficient amount of the low k silicon oxide dielectric material had been deposited to fill the spaces between the metal lines, the deposition can be stopped and the substrate removed from the reactor. Visual inspection of the low k silicon oxide dielectric material under UV light should reveal no hazing on the surface, nor should the presence of any particles be noted. When the dielectric constant of the deposited low k material is measured, it will be found to be below 3.0, indicating that the deposition has been carried out successfully without attack of the methyl group of the methyl silane reactant, and without the occurrence of pressure spiking or hazing of the film.

Thus, the invention provides a process for depositing low k silicon oxide dielectric material by reaction of an organo silane reactant with a hydrogen peroxide reactant while pressure spiking and hazing of the surface of the deposited film are suppressed and the low dielectric constant of the low k silicon oxide dielectric material is maintained.

Having thus described the invention what is claimed is:

1. A process for making low k silicon oxide dielectric material having a dielectric constant greater than 3.0 while suppressing pressure spikes during the formation of the low k silicon oxide dielectric material which comprises reacting an organo-silane and hydrogen peroxide in a reactor chamber containing a substrate support with a silicon substrate thereon while maintaining an electrical bias potential on said substrate support to thereby form low k silicon oxide dielectric material having a dielectric constant no greater than 3.0 while suppressing pressure spikes.

2. The process for making low k silicon oxide dielectric material of claim 1 wherein said electrical bias potential on said substrate support is a positive DC electrical bias potential ranging from the minimum bias potential capable of suppressing increase in the dielectric constant of the low k silicon oxide dielectric material above 3.0, up to a maximum bias potential below that level which may result in arcing and resulting damage to the substrate.

3. The process for making low k silicon oxide dielectric material of claim 2 wherein said positive DC electrical bias potential on said substrate support ranges from about +50 volts to about +300 volts.

4. The process for making low k silicon oxide dielectric material of claim 1 wherein said electrical bias potential on said substrate support is a low frequency AC electrical bias potential ranging from the minimum bias potential capable of suppressing an increase in the dielectric constant of the low k silicon oxide dielectric material above 3.0, up to a maximum bias potential below that level which may result in arcing and resulting damage to the substrate.

5. The process for making low k silicon oxide dielectric material of claim 4 wherein said low frequency AC electrical bias potential on said substrate support ranges from about +50/−50 volts to about +300/−300 volts.

6. A process for making low k silicon oxide dielectric material having a dielectric constant no greater than 3.0 which comprises reacting organo-silane and hydrogen peroxide reactants in a reactor chamber containing a substrate support with a silicon substrate thereon at a ratio of organo-silane reactant to hydrogen peroxide reactant which will suppress pressure spikes during the formation of said low k silicon oxide dielectric material, and while maintaining an electrical bias potential on said substrate support to thereby form low k silicon oxide dielectric material having a dielectric constant no greater than 3.0 while suppressing pressure spikes.

7. The process for making low k silicon oxide dielectric material of claim 6 wherein said electrical bias potential on said substrate support is selected from the group consisting of a positive DC electrical bias potential and a low frequency AC electrical bias potential, with the bias potential ranging from the minimum bias potential capable of suppressing an increase in the dielectric constant of the low k silicon oxide dielectric material above 3.0, up to a maximum bias potential below that level which may result in arcing and resulting damage to the substrate.

8. The process for making low k silicon oxide dielectric material of claim 7 wherein said electrical bias potential on said substrate support is a positive DC electrical bias potential which ranges from about +50 volts to about +300 volts.

9. The process for making low k silicon oxide dielectric material of claim 7 wherein said electrical bias potential on said substrate support comprises a low frequency AC electrical bias potential which ranges from a minimum of about +50/−50 volts up to a maximum of about +300/−300 volts.

10. A process for making low k silicon oxide dielectric material having a dielectric constant no greater than 3.0 which comprises the steps of:
   a) reacting organo-silane and hydrogen peroxide reactants in a reactor chamber containing a substrate support with a silicon substrate thereon at a reactant flow ratio of organo-silane reactant to hydrogen peroxide reactant of not more than 10.6 sccm of organo-silane reactant per 0.1 grams/minute of hydrogen peroxide reactant; and
   b) maintaining an electrical bias potential on said substrate support during said reaction;
   to thereby form low k silicon oxide dielectric material having a dielectric constant no greater than 3.0 while suppressing pressure spikes.

11. The process for making low k silicon oxide dielectric material of claim 10 wherein said reactant flow ratio of organo-silane and hydrogen peroxide does not exceed 10 sccm of organo-silane reactant per 0.1 grams/minute of hydrogen peroxide reactant.

12. The process for making low k silicon oxide dielectric material of claim 10 wherein said electrical bias potential on said substrate support is selected from the group consisting of a positive DC electrical bias potential and a low frequency AC electrical bias potential, with the bias potential ranging from the minimum bias potential capable of suppressing increase in the dielectric constant of the low k silicon oxide dielectric material above 3.0, up to a maximum bias potential below that level which may result in arcing and resulting damage to the substrate.

13. The process for making low k silicon oxide dielectric material of claim 12 wherein said electrical bias potential on said substrate support is a positive DC electrical bias potential which ranges from about +50 volts to about +300 volts.

14. The process for making low k silicon oxide dielectric material of claim 12 wherein said electrical bias potential on said substrate support comprises a low frequency AC electrical bias potential which ranges from a minimum of from about +50/−50 volts up to a maximum of about +300/−300 volts.

15. The process for making low k silicon oxide dielectric material of claim 10 wherein said organo-silane reactant comprises a silicon atom bonded to one or more organic moieties.

16. The process for making low k silicon oxide dielectric material of claim 10 wherein said organo-silane reactant is selected from the group consisting of methyl silane, dimethyl silane, and a substituted silane having at least one carbon-containing group thereon having the general formula $-(C)_y(CH_3)_z$, where y is an integer from 1 to 4 for a branched alkyl group and from 3 to 5 for a cyclic alkyl group and z is 2y+1 for a branched alkyl group and 2y−1 for a cyclic alkyl group.

17. A process for making low k silicon oxide dielectric material having a dielectric constant no greater than 3.0 which comprises the steps of:
   a) reacting organo-silane and hydrogen peroxide reactants in a reactor chamber containing a substrate support with a silicon substrate thereon at a reactant flow ratio of organo-silane reactant to hydrogen peroxide reactant of not more than 10.6 sccm of organo-silane reactant per 0.1 grams/minute of hydrogen peroxide reactant; and
   b) maintaining on said substrate support during said reaction an electrical bias selected from the group consisting of a positive DC electrical bias and a low frequency AC electrical bias potential, with the bias potential ranging from the minimum bias potential capable of suppressing increase in the dielectric constant of the low k silicon oxide dielectric material above 3.0, up to a maximum bias potential below that level which may result in arcing and resulting damage to the substrate;
   to thereby form low k silicon oxide dielectric material having a dielectric constant no greater than 3.0 while suppressing pressure spikes.

18. The process for making low k silicon oxide dielectric material of claim 17 wherein said electrical bias potential on said substrate support is a positive DC electrical bias potential which ranges from about +50 volts to about +300 volts.

19. The process for making low k silicon oxide dielectric material of claim 17 wherein said electrical bias on said substrate support comprises a low frequency AC electrical bias potential which ranges from a minimum of about +50/−50 volts up to maximum of about +300/−300 volts.

20. The process for making low k silicon oxide dielectric material of claim 17 wherein said organo-silane reactant comprises methyl silane.

* * * * *